United States Patent
Umeda et al.

(10) Patent No.: US 7,535,154 B2
(45) Date of Patent: May 19, 2009

(54) PIEZOELECTRIC THIN-FILM RESONATOR

(75) Inventors: Keiichi Umeda, Omihachiman (JP); Hideki Kawamura, Tokyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/099,880

(22) Filed: Apr. 9, 2008

(65) Prior Publication Data

US 2008/0179995 A1 Jul. 31, 2008

Related U.S. Application Data

(63) Continuation of application No. PCT/JP2006/302264, filed on Feb. 9, 2006.

(51) Int. Cl.
*H03H 9/17* (2006.01)
*H01L 41/047* (2006.01)

(52) U.S. Cl. .................. 310/320; 310/324; 310/349; 310/364; 333/189

(58) Field of Classification Search .............. 310/320, 310/324, 349, 363, 364; 333/187, 189
See application file for complete search history.

(56) References Cited

U.S. PATENT DOCUMENTS

| | | | |
|---|---|---|---|
| 4,642,508 A * | 2/1987 | Suzuki et al. ............... | 310/321 |
| 6,215,375 B1 | 4/2001 | Larson et al. | |
| 6,424,237 B1 | 7/2002 | Ruby et al. | |
| 6,788,170 B1 | 9/2004 | Kaitila et al. | |
| 6,812,619 B1 | 11/2004 | Kaitila et al. | |
| 7,301,260 B2 * | 11/2007 | Kawakubo ................ | 310/324 |
| 7,388,454 B2 * | 6/2008 | Ruby et al. ................ | 333/187 |
| 7,432,631 B2 * | 10/2008 | Taniguchi et al. ........... | 310/320 |
| 7,477,001 B2 * | 1/2009 | Sato ............................ | 310/320 |

| | | | |
|---|---|---|---|
| 2002/0014808 A1 * | 2/2002 | Misu et al. ................... | 310/312 |
| 2002/0158716 A1 * | 10/2002 | Pensala ..................... | 333/195 |

(Continued)

FOREIGN PATENT DOCUMENTS

DE 102 41 425 A1 3/2004

(Continued)

OTHER PUBLICATIONS

Official communication issued in counterpart International Application No. PCT/JP2006/302264, mailed on May 16, 2006.

*Primary Examiner*—Thomas M Dougherty
(74) *Attorney, Agent, or Firm*—Keating & Bennett, LLP

(57) ABSTRACT

In a piezoelectric resonator, a portion of a thin film unit is supported by a substrate. A portion of the thin film unit acoustically isolated from the substrate includes a) a vibration unit and b) an additional film. The vibration unit includes a piezoelectric film sandwiched between a pair of electrodes. The piezoelectric film is overlapped with the pair of electrodes in plan view. The additional film is disposed on one of the piezoelectric film and the electrodes so as to extend along at least a portion of the periphery of the vibration unit. When x (MN·second/m$^3$) denotes an acoustic impedance of the additional film defined by the square root of the product of the density and Young's modulus, A denotes the product of the density and the thickness of the additional film, B denotes the product of the densities and the thicknesses of the electrodes, and y=A/B, the following conditional expressions are satisfied:

In the range of $9.0 \leq x < 44.0$, $0.0092 \cdot x + 0.88 \leq y < 0.067 \cdot x + 0.60$ (1a)

In the range of $44.0 \leq x < 79.0$, $-0.0035 \cdot x + 1.45 \leq y < 0.015 \cdot x + 2.9$ (1b).

16 Claims, 9 Drawing Sheets

U.S. PATENT DOCUMENTS

2002/0190814 A1    12/2002   Yamada et al.
2004/0195937 A1*   10/2004   Matsubara et al. .......... 310/320
2008/0051039 A1*    2/2008   Iwasaki et al. ................ 455/73

FOREIGN PATENT DOCUMENTS

| | | |
|---|---|---|
| EP | 0 973 256 A1 | 1/2000 |
| EP | 1 406 386 A2 | 4/2004 |
| JP | 9-27729 A | 1/1997 |
| JP | 11-340775 A | 12/1999 |
| JP | 2000-312130 A | 11/2000 |
| JP | 2001-028528 A | 1/2001 |
| JP | 2001-251159 A | 9/2001 |
| JP | 2004-304704 * | 10/2004 |
| JP | 2005-109702 A | 4/2005 |
| JP | 2005-159402 A | 6/2005 |
| WO | 99/37023 A1 | 7/1999 |

* cited by examiner (a) 200nm (b) 340nm (c) 350nm (d) 450nm (e) 520nm (f) 530nm (a) $-\frac{\lambda}{5}$ (b) $-\frac{\lambda}{10}$ (c) 0

(d) $\frac{\lambda}{10}$ (e) $\frac{\lambda}{5}$

PIEZOELECTRIC THIN-FILM RESONATOR

BACKGROUND OF THE INVENTION

1. Field of the Invention

The present invention relates to a piezoelectric thin-film resonator.

2. Description of the Related Art

Piezoelectric thin film resonators include a thin film unit disposed on a substrate. The thin film unit has a piezoelectric film sandwiched by upper and lower electrodes. An overlapping portion of the upper and lower electrodes functions as a vibration unit, which is acoustically isolated from the substrate. When an alternating voltage is applied to the vibration unit, the vibration unit operates in a thickness extensional vibration mode at a frequency for which the thickness of the vibration unit is approximately equal to a half wavelength. At the same time, Lamb waves are excited so as to propagate in a planar direction of the piezoelectric film. When the planar shape of the vibration unit is square, standing waves occur between the opposing sides of the vibration unit, and therefore, a spurious component is generated.

As an example of the related art that prevents the formation of a spurious component of the Lamb waves, Japanese Unexamined Patent Application Publication No. 2000-332568 describes a vibration unit having a non-square, irregular polygonal planar shape.

In addition, WO99/37023 describes technology in which an additional film is provided in a peripheral portion of a vibration unit.

Furthermore, PCT Japanese Translation Patent Publication No. 2003-505906 describes technology in which the thickness of the end portions of an electrode film is reduced so as to be thinner than the middle portion, thereby forming a stepped portion.

In the technology described in Japanese Unexamined Patent Application Publication No. 2000-332568, spurious components of the Lamb waves having a long wavelength and a short wavelength can be prevented. However, the Q value of resonance is disadvantageously decreased. In addition, if the vibration unit has a non-rectangular, irregular polygonal planar shape, it is difficult to reduce the size of the vibration unit.

In the technology described in WO99/37023, the resonant frequency of the peripheral portion of the vibration unit is decreased by using an additional film. In this way, frequency-increasing energy that relatively increases the resonance frequency of the vibration unit is trapped. Accordingly, the problem of the formation of a spurious component of the Lamb waves is not addressed.

Furthermore, in the technology described in PCT Japanese Translation Patent Publication No. 2003-505906, a spurious component of the Lamb waves having a long wavelength can be suppressed. However, a spurious component of the Lamb waves having a short wavelength cannot be suppressed.

SUMMARY OF THE INVENTION

To overcome the problems described above, preferred embodiments of the present invention provide a piezoelectric thin-film resonator which suppresses a spurious component having a short wavelength.

A piezoelectric resonator according to a preferred embodiment of the present invention includes a substrate and a thin film unit including a portion supported by the substrate and a portion acoustically isolated from the substrate. The portion acoustically isolated from the substrate includes a) a vibration unit and b) an additional film. The vibration unit includes a piezoelectric film sandwiched between a pair of electrodes and having a Poisson ratio less than or equal to about 1/3. The piezoelectric film is overlapped with the pair of electrodes in plan view. The additional film is disposed on one of the piezoelectric film and the electrode so as to extend along at least a portion of the periphery of the vibration unit in plan view. When x (MN·second/m$^3$) denotes an acoustic impedance of the additional film defined by the square root of the product of the density and Young's modulus, A denotes the product of the density and the thickness of the additional film, B denotes the product of the densities and the thicknesses of the electrodes, and y=A/B, the A/B ratio y satisfies one of the following conditional expressions (1a) and (1b):

In the range of $9.0 \leq x < 44.0$, $0.0092 \cdot x + 0.88 \leq y < 0.067 \cdot x + 0.60$  (1a)

(ii) In the range of $44.0 \leq x < 79.0$, $-0.0035 \cdot x + 1.45 \leq y < 0.015 \cdot x + 2.9$  (1b).

In the above-described structure, by using a piezoelectric film having a Poisson ratio less than or equal to about 1/3, the energy of thickness extensional vibration is maintained.

According to this structure, by setting the A/B ratio for the additional film to an optimum value, Lamb waves of a short wavelength can be transmitted from the vibration unit to the peripheral portion (outside the vibration unit), thereby preventing reflection of the Lamb waves towards the vibration unit. Accordingly, spurious components of the Lamb waves of a short wavelength are suppressed.

In addition, a piezoelectric resonator according to another preferred embodiment of the present invention includes a substrate and a thin film unit including a portion supported by the substrate and a portion acoustically isolated from the substrate. The portion acoustically isolated from the substrate includes a) a vibration unit and b) an additional film. The vibration unit includes a piezoelectric film sandwiched between a pair of electrodes and having a Poisson ratio less than or equal to about 1/3. The piezoelectric film is overlapped with the pair of electrodes in plan view. The additional film is disposed on one of the piezoelectric film and the electrode so as to extend along at least a portion of the periphery of the vibration unit in plan view. The additional film is made of any one of $SiO_2$, Al, AlN, Ti, Cr, Cu, Mo, Ru, Ta, and Pt. When A denotes the product of the density and the thickness of the additional film, B denotes the product of the density and the thickness of the electrodes, and y=A/B, the A/B ratio y lies in the range of a lower limit and an upper limit indicated in the following Table 1:

TABLE 1

| Material of Additional Film | Acoustic Impedance x: $Z = \sqrt{\rho \cdot E}$ (MN · second/m$^3$) | A/B Ratio y: Lower Limit | A/B Ratio y: Upper Limit |
|---|---|---|---|
| $SiO_2$ | 12 | 0.9 | 1.2 |
| Al | 14 | 1.0 | 1.5 |
| AlN | 23 | 1.2 | 2.4 |
| Ti | 33 | 1.2 | 1.8 |
| Cr | 35 | 1.2 | 3.1 |
| Cu | 43 | 1.2 | 2.4 |
| Mo | 45 | 1.3 | 3.8 |
| Ru | 60 | 1.2 | 4.0 |
| Ta | 62 | 1.3 | 3.6 |
| Pt | 71 | 1.3 | 3.6 |

In the above-described structure, by using a piezoelectric film having a Poisson ratio less than or equal to about 1/3, the energy of thickness extensional vibration is maintained.

According to this structure, by setting the A/B ratio for the additional film to an optimum value, Lamb waves of a short wavelength can be transmitted from the vibration unit to the peripheral portion (outside the vibration unit), thereby preventing reflection of the Lamb waves towards the vibration unit. Accordingly, spurious components of the Lamb waves of a short wavelength are suppressed.

Preferably, in the piezoelectric resonators having the above-described structures, a stepped portion forming film is provided on one of the two electrodes remote from the substrate so as to extend inside the periphery of the vibration unit and along the periphery of the vibration unit with a space therebetween in plan view.

According to this structure, by reducing the thickness of the end portion of the vibration unit to a value less than the thickness of the middle portion of the vibration unit, spurious components in the range less than or equal to the resonant frequency are suppressed.

Preferably, when L (μm) denotes a distance between an end of the vibration unit and an end of the additional film adjacent to the vibration unit, a direction in which the end of the additional film moves away from the vibration unit is negative, a direction in which the additional film overlaps with the vibration unit is positive, and t (μm) denotes the thickness of the vibration unit, the following conditional expression (2) is satisfied:

$$-t/5 \leq L \leq t/5 \qquad (2).$$

According to this structure, by setting the distance L between the vibration unit and the additional film to an optimum value, Lamb waves of a short wavelength can be transmitted from the vibration unit to the peripheral portion (outside the vibration unit), thereby preventing reflection of the Lamb waves towards the vibration unit. Accordingly, spurious components of the Lamb waves of a short wavelength are suppressed.

Preferably, the piezoelectric film is formed from AlN.

In this case, since the sound speed of the thickness extensional vibration is increased, a high-frequency can be easily obtained.

Preferably, the additional film is made of one of $SiO_2$ and AlN.

According to this structure, by using the structural material of the resonator (e.g., the material of the piezoelectric film or the insulating film) for the additional film, a different material is not required. Thus, the cost of a device can be reduced.

Preferably, the piezoelectric film is made of an electrical conductive material.

In this case, since the additional film made of an electrical conductive material and provided on the electrode remote from the substrate reduces an interconnection resistance of the electrode, electrical loss is reduced. For example, the additional film can be easily formed with high patterning precision by a combination of a vapor deposition technique and a liftoff technique. In addition, by using a liftoff technique, the additional film can be patterned without damaging the vibration unit.

Furthermore, a preferred embodiment of the present invention provides a filter including at least one of the piezoelectric resonators having the above-described structures and arranged in a planar direction.

The filter can provide a high Q value regardless of the shapes of the electrodes. Accordingly, the layout of the resonators in the filter is facilitated. Thus, the size of the filter can be reduced.

Still furthermore, a preferred embodiment of the present invention provides a dual-mode filter including at least one of the piezoelectric resonators having any one of the above-described structures. The piezoelectric resonators are stacked in a thickness direction and are acoustically coupled in the thickness direction.

In this case, since the resonators are arranged in the thickness direction, the size of a piezoelectric filter can be reduced.

According to preferred embodiments of the present invention, a piezoelectric thin-film resonator suppresses spurious components in a short wavelength region.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1A:
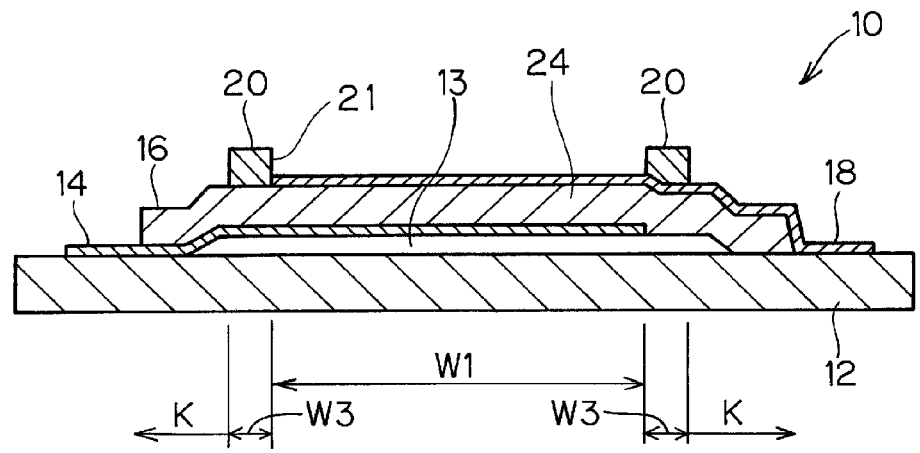
FIG. 1A is a first cross-sectional view of a piezoelectric resonator according to a first preferred embodiment of the present invention.
Figure 1B:
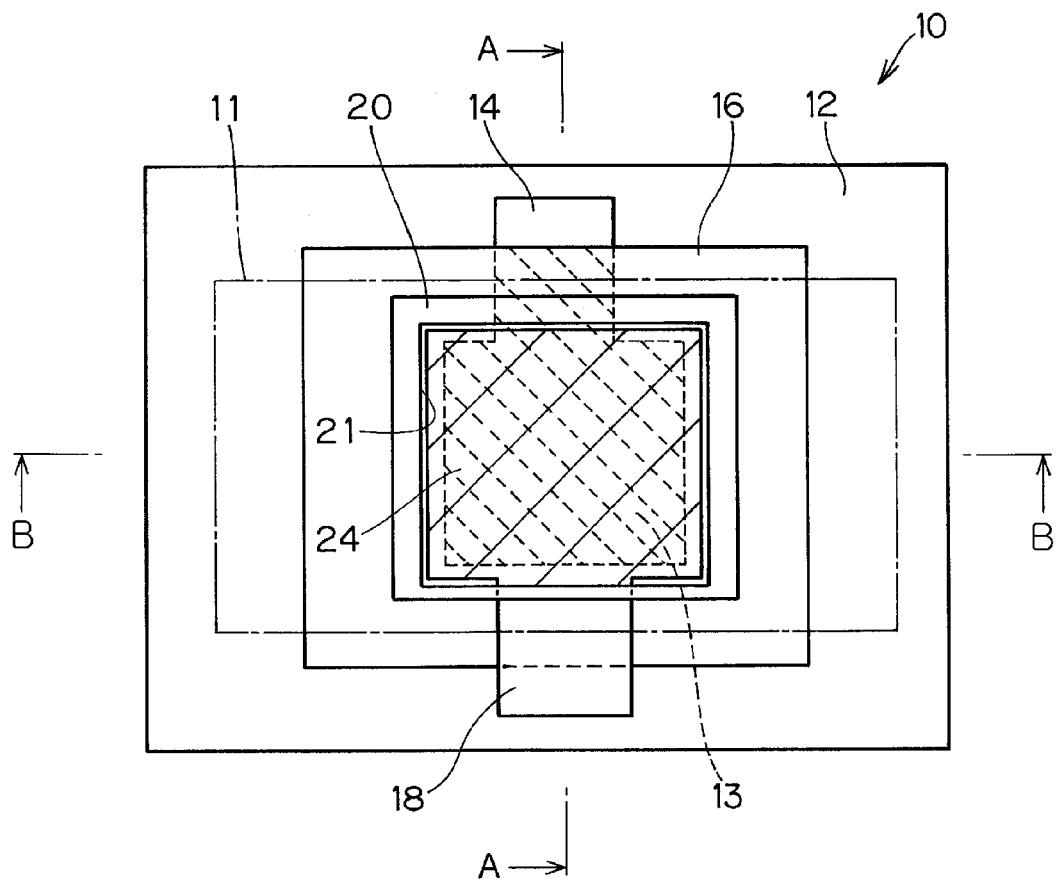
FIG. 1B is a plan view of the piezoelectric resonator according to the first preferred embodiment of the present invention.
Figure 1C:
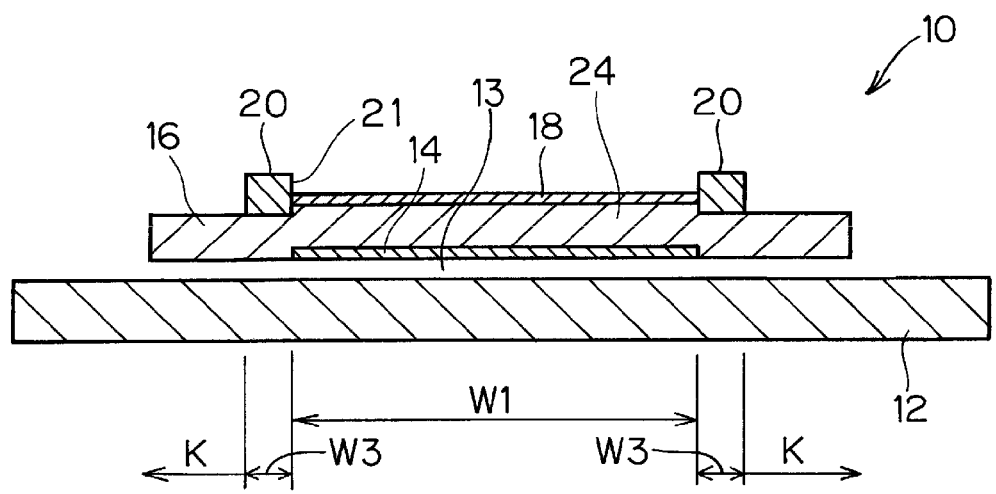
FIG. 1C is a second cross-sectional view of the piezoelectric resonator according to the first preferred embodiment of the present invention.

A piezoelectric resonator 10 according to a first preferred embodiment is described with reference to FIGS. 1A, 1B, 1C, and 2. FIG. 1B is a plan view. FIG. 1A is a cross-sectional view taken along a line A-A in FIG. 1B. FIG. 1C is a cross-sectional view taken along a line B-B in FIG. 1B.

As schematically shown in FIGS. 1A, 1B, and 1B, the piezoelectric resonator 10 includes a thin film unit provided on a substrate 12. That is, a lower electrode 14, a piezoelectric film 16, an upper electrode 18, and an additional film 20 are sequentially stacked on the substrate 12. The lower electrode 14 includes a portion supported by the substrate 12 and a portion raised above the substrate 12 with a gap 13 therebetween. A vibration unit 24 is provided on the raised portion. The vibration unit 24 includes the piezoelectric film 16 disposed between the lower electrode 14 and the upper electrode 18. As shown in FIG. 1B, the gap 13 is formed by disposing a sacrificial layer 11 on the substrate 12, stacking the layers including the lower electrode 14 on the sacrifice layer 11, and subsequently, removing the sacrifice layer 11.

The vibration unit 24 occupies an area in which the lower electrode 14 and the upper electrode 18 overlap when viewed from the thickness direction (a direction perpendicular to the plane of FIG. 1b). When viewed from the thickness direction, the additional film 20 extends along the peripheral edge of the vibration unit 24 and has a substantially rectangular hollow shape, so that the vibration unit 24 is disposed in an opening 21 of the additional film 20. That is, as shown in FIG. 1A, an additional film portion having a width of W3 and a thickness that is increased by the additional film 20 is disposed next to and outside the vibration unit 24 having a width of W1. An outer portion indicated by a symbol "K" continuously and outwardly extends from the additional film portion.

In FIG. 1B, an invisible portion of the lower electrode 14 is indicated by dotted slanted lines. In addition, a visible portion of the upper electrode 18 located in the opening 21 of the additional film 20 is indicated by solid slanted lines. In FIG. 1B, to illustrate the overlapping relationship, the sizes of the lower electrode 14, the upper electrode 18, and the opening 21 of the additional film 20 are different from one another. However, in practice, these sizes are substantially the same (e.g., about 145 µm by about 145 µm). When viewed from the thickness direction, the lower electrode 14, the upper electrode 18, and the opening 21 of the additional film 20 substantially overlap.

When the additional film 20 is made of a material used for a structural material of the piezoelectric resonator 10, an additional material is not required. Thus, the cost of the device can be reduced. Accordingly, it is desirable that the additional film 20 is made of an electrical conductive material, such as $SiO_2$, or AlN. In particular, if the additional film 20 disposed on the upper electrode 18 is made of a conductive material, the interconnection resistance of the upper electrode 18 is reduced, and therefore, electrical loss is reduced. In such a case, the additional film 20 can be easily formed with high patterning precision using a combination of a vapor deposition technique and a liftoff technique. In addition, by using a liftoff technique, the additional film 20 can be patterned without damaging the vibration unit 24.

Particular examples are described below. In the first preferred embodiment, the piezoelectric resonator 10 including the lower electrode 14, the piezoelectric film 16, and the upper electrode 18 having the same size and structure is produced. Only the thicknesses of the additional films 20 are different.

A resonant frequency Fs of the piezoelectric resonator 10 is about 1840 MHz. An anti-resonant frequency Fp is about 1891 MHz. The piezoelectric resonators of the following first to tenth preferred embodiments have substantially the same resonant frequency Fs and anti-resonant frequency Fp.

The piezoelectric film 16 has a thickness of about 2640 nm and is made of AlN. AlN has a Poisson ratio less than or equal to about 1/3. When AlN is used for the piezoelectric film 16, a sound speed of thickness extensional vibration is high, and therefore, a high frequency can be easily obtained. Accordingly, AlN is suitable for the piezoelectric film 16. The upper electrode 18 includes an Al layer having a thickness of about 100 nm and a Ti layer having a thickness of about 10 nm. The Ti layer is disposed so as to be adjacent to the piezoelectric film 16. The lower electrode 14 includes a Pt layer having a thickness of about 10 nm, a Ti layer having a thickness of about 10 nm, an Al layer having a thickness of about 100 nm, and a Ti layer having a thickness of about 10 nm layered on the piezoelectric film 16 in this order.

The additional films 20 having thicknesses of about 110 nm, about 120 nm, about 200 nm, about 240 nm, and about 250 nm are produced using Cu having a density of 8.9 g/cm³.

Figure 2:
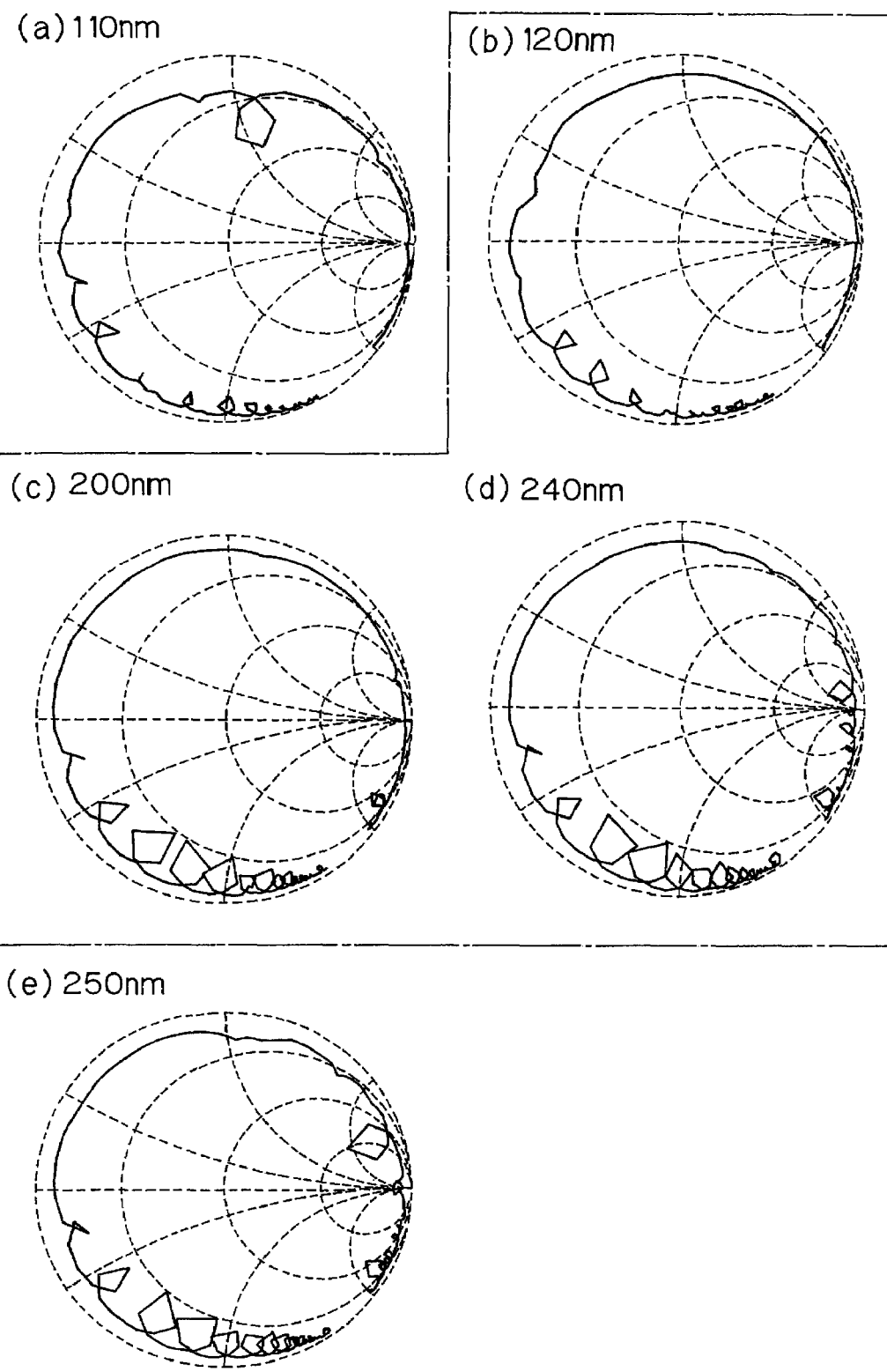
FIG. 2 is a Smith chart of the piezoelectric resonator according to the first preferred embodiment of the present invention.

FIG. 2 illustrates the impedance Smith charts of these piezoelectric resonators 10. As shown in FIG. 2, in a section surrounded by an alternate long and short dash line, that is, in a section in which the thickness of the additional film 20 is in the range of about 120 nm to about 240 nm, the impedance in the upper half circle of the Smith chart for a frequency range between the resonant frequency and the anti-resonant frequency is smooth. This indicates that spurious components are suppressed.

A denotes the product of the density and the thickness of the additional film 20. B denotes the sum of products of densities and the thicknesses of the electrodes 14 and 18. Table 2 shows a relationship between an A/B ratio and the degree of suppression of spurious components. When spurious components are suppressed, the degree of suppression of spurious components is expressed as a symbol "○".

TABLE 2

| A: Density × Thickness of Additional Film | B: Density × Thickness of Electrode | A/B Ratio | Degree of Suppression of Spurious Components |
| --- | --- | --- | --- |
| 979 | 889 | 1.1 | X |
| 1068 | 889 | 1.2 | ○ |
| 1780 | 889 | 2.0 | ○ |
| 2136 | 889 | 2.4 | ○ |
| 2225 | 889 | 2.5 | X |

As shown in Table 2, when the A/B ratio is in the range of about 1.2 to about 2.4, the spurious components are suppressed.

Here, the product B of the densities and the thicknesses of the electrodes 14 and 18 is the sum of the product of the density and the thickness of the material of the lower electrode 14 and the product of the density and the thickness of the material of the upper electrode 18. These values are shown in Table 3.

TABLE 3

| Material | Density (g/cm³) | Thickness (nm) | Density × Thickness |
| --- | --- | --- | --- |
| Al Electrode × 2 layers | 2.7 | 200 | 540 |
| Pt Electrode | 21.4 | 10 | 214 |
| Ti Electrode × 3 layers | 4.5 | 30 | 135 |
| Density × Thickness of Electrode | — | — | 889 |

Similarly, the product of the density and the thickness of the piezoelectric AlN film is computed as follows: the density of 3.3 g/cm³ × the thickness of 2640 nm = 8712.

The reason why A is defined as the product of the density and the thickness of the additional film 20, B is defined as the sum of the products of the densities and thicknesses of the electrodes 14 and 18, and the A/B ratio is introduced is because the ratio of the resonant frequency of the vibration unit 24 to the resonant frequency of the outer peripheral portion extending so as to surround the vibration unit 24 is related to suppression of the spurious components. In addition, the resonant frequency of the vibration unit 24 is decreased in proportion to the mass load of the vibration unit 24, and the resonant frequency of the outer peripheral portion is decreased in proportion to the mass load of the outer peripheral portion. As a result, the A/B ratio has an impact on the suppression of spurious components.

Second Preferred Embodiment

In a second preferred embodiment, the sizes and structures similar to those of the particular example of the first preferred embodiment are used except for the additional films 20. In the second preferred embodiment, the additional films 20 are made of $SiO_2$ having a density of 2.2 g/cm³ and have thicknesses of about 200 nm, about 340 nm, about 350 nm, about 450 nm, about 520 nm, and about 530 nm.

Figure 3:
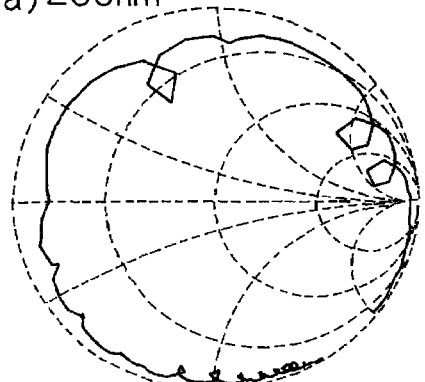
FIG. 3 is a Smith chart of a piezoelectric resonator according to a second preferred embodiment of the present invention.
Figure 3:
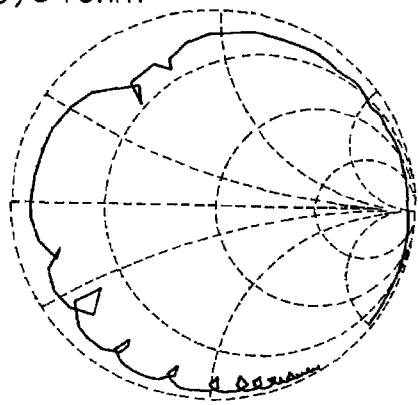
Figure 3:
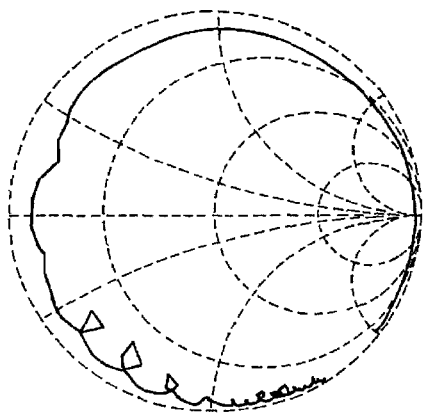
Figure 3:
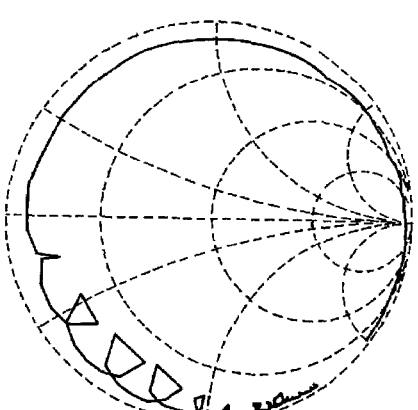
Figure 3:
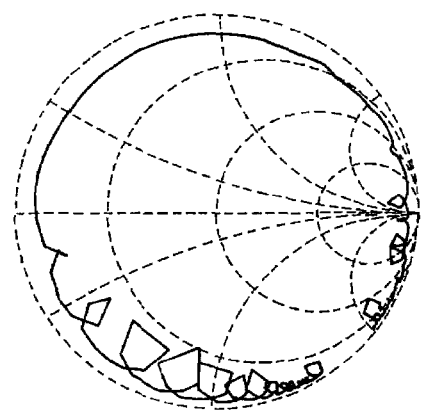
Figure 3:
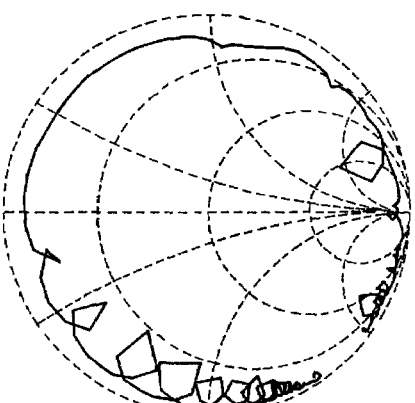

FIG. 3 illustrates the impedance Smith charts of these piezoelectric resonators 10 including additional films 20 having these thicknesses.

A relationship between the A/B ratio and the degree of spurious suppression for the piezoelectric resonators 10 including additional films 20 having these thicknesses is shown in Table 4.

TABLE 4

| A: Density × Thickness of Additional Film | B: Density × Thickness of Electrode | A/B Ratio | Degree of Suppression of Spurious Components |
|---|---|---|---|
| 440 | 889 | 0.5 | X |
| 748 | 889 | 0.8 | X |
| 770 | 889 | 0.9 | ○ |
| 990 | 889 | 1.1 | ○ |
| 1,144 | 889 | 1.2 | ○ |
| 1,166 | 889 | 1.3 | X |

As shown in Table 4, when the A/B ratio is in the range of about 0.9 to about 1.2, the spurious components are suppressed. Note that since the film structures of the electrodes 14 and 18 are similar to those of the first preferred embodiment, the values of B are the same as those shown in Table 2 of the first preferred embodiment.

Third Preferred Embodiment

In a third preferred embodiment, the sizes and structures similar to those of the particular example of the first preferred embodiment are used except for the additional films 20. In the third preferred embodiment, the additional films 20 are made of Al having a density of 2.7 g/cm³ and have thicknesses of about 310 nm, about 320 nm, about 510 nm, and about 520 nm.

A relationship between the A/B ratio and the degree of spurious suppression for the piezoelectric resonators 10 including additional films 20 having these thicknesses is shown in Table 5.

TABLE 5

| A: Density × Thickness of Additional Film | B: Density × Thickness of Electrode | A/B Ratio | Degree of Suppression of Spurious Components |
|---|---|---|---|
| 682 | 889 | 0.8 | X |
| 864 | 889 | 1.0 | ○ |
| 1,377 | 889 | 1.5 | ○ |
| 1,404 | 889 | 1.6 | X |

As shown in Table 5, when the A/B ratio is in the range of about 1.0 to about 1.5, the spurious components are suppressed.

Fourth Preferred Embodiment

In a fourth preferred embodiment, the sizes and structures similar to those of the particular example of the first preferred embodiment are used except for the additional films 20. In the fourth preferred embodiment, the additional films 20 are made of AlN having a density of 3.3 g/cm³ and have thicknesses of about 320 nm, about 330 nm, about 650 nm, and about 660 nm.

A relationship between the A/B ratio and the degree of spurious suppression for the piezoelectric resonators 10 including additional films 20 having these thicknesses is shown in Table 6.

TABLE 6

| A: Density × Thickness of Additional Film | B: Density × Thickness of Electrode | A/B Ratio | Degree of Suppression of Spurious Components |
|---|---|---|---|
| 1,056 | 889 | 1.1 | X |
| 1,089 | 889 | 1.2 | ○ |
| 2,145 | 889 | 2.4 | ○ |
| 2,178 | 889 | 2.5 | X |

As shown in Table 6, when the A/B ratio is in the range of about 1.2 to about 2.4, the spurious components are suppressed.

Fifth Preferred Embodiment

In a fifth preferred embodiment, the sizes and structures similar to those of the particular example of the first preferred embodiment are used except for the additional films 20. In the fifth preferred embodiment, the additional films 20 are made of Ti having a density of 4.5 g/cm³ and have thicknesses of about 220 nm, about 230 nm, about 370 nm, and about 380 nm.

A relationship between the A/B ratio and the degree of spurious suppression for the piezoelectric resonators 10 including additional films 20 having these thicknesses is shown in Table 7.

TABLE 7

| A: Density × Thickness of Additional Film | B: Density × Thickness of Electrode | A/B Ratio | Degree of Suppression of Spurious Components |
|---|---|---|---|
| 990 | 889 | 1.1 | X |
| 1,035 | 889 | 1.2 | ○ |
| 1,665 | 889 | 1.8 | ○ |
| 1,710 | 889 | 1.9 | X |

As shown in Table 7, when the A/B ratio is in the range of about 1.2 to about 1.8, the spurious components are suppressed.

Sixth Preferred Embodiment

In a sixth preferred embodiment, the sizes and structures similar to those of the particular example of the first preferred embodiment are used except for the additional films 20. In the sixth preferred embodiment, the additional films 20 are made of Cr having a density of 7.2 g/cm$^3$ and have thicknesses of about 140 nm, about 150 nm, about 380 nm, and about 390 nm.

A relationship between the A/B ratio and the degree of spurious suppression for the piezoelectric resonators 10 including additional films 20 having these thicknesses is shown in Table 8.

TABLE 8

| A: Density × Thickness of Additional Film | B: Density × Thickness of Electrode | A/B Ratio | Degree of Suppression of Spurious Components |
|---|---|---|---|
| 1,008 | 889 | 1.1 | X |
| 1,080 | 889 | 1.2 | ○ |
| 2,736 | 889 | 3.1 | ○ |
| 2,808 | 889 | 3.2 | X |

As shown in Table 8, when the A/B ratio is in the range of about 1.2 to about 3.1, the spurious components are suppressed.

Seventh Preferred Embodiment

In a seventh preferred embodiment, the sizes and structures similar to those of the particular example of the first preferred embodiment are used except for the additional films 20. In the seventh preferred embodiment, the additional films 20 are made of Mo having a density of 10.2 g/cm$^3$ and have thicknesses of about 100 nm, about 110 nm, about 330 nm, and about 340 nm.

A relationship between the A/B ratio and the degree of spurious suppression for the piezoelectric resonators 10 including additional films 20 having these thicknesses is shown in Table 9.

TABLE 9

| A: Density × Thickness of Additional Film | B: Density × Thickness of Electrode | A/B Ratio | Degree of Suppression of Spurious Components |
|---|---|---|---|
| 1,020 | 889 | 1.1 | X |
| 1,122 | 889 | 1.3 | ○ |
| 3,366 | 889 | 3.8 | ○ |
| 3,468 | 889 | 3.9 | X |

As shown in Table 9, when the A/B ratio is in the range of about 1.3 to about 3.8, the spurious components are suppressed.

Eighth Preferred Embodiment

In an eighth preferred embodiment, the sizes and structures similar to those of the particular example of the first preferred embodiment are used except for the additional films 20. In the eighth preferred embodiment, the additional films 20 are made of Ru having a density of 12.2 g/cm$^3$ and have thicknesses of about 80 nm, about 90 nm, about 290 nm, and about 300 nm.

A relationship between the A/B ratio and the degree of spurious suppression for the piezoelectric resonators 10 including additional films 20 having these thicknesses is shown in Table 10.

TABLE 10

| A: Density × Thickness of Additional Film | B: Density × Thickness of Electrode | A/B Ratio | Degree of Suppression of Spurious Components |
|---|---|---|---|
| 976 | 889 | 1.1 | X |
| 1,098 | 889 | 1.2 | ○ |
| 3,538 | 889 | 4.0 | ○ |
| 3,660 | 889 | 4.1 | X |

As shown in Table 10, when the A/B ratio is in the range of about 1.2 to about 4.0, the spurious components are suppressed.

Ninth Preferred Embodiment

In a ninth preferred embodiment, the sizes and structures similar to those of the particular example of the first preferred embodiment are used except for the additional films 20. In the ninth embodiment, the additional films 20 are made of Ta having a density of 16.6 g/cm$^3$ and have thicknesses of about 60 nm, about 70 nm, about 190 nm, and about 200 nm.

A relationship between the A/B ratio and the degree of spurious suppression for the piezoelectric resonators 10 including additional films 20 having these thicknesses is shown in Table 11.

TABLE 11

| A: Density × Thickness of Additional Film | B: Density × Thickness of Electrode | A/B Ratio | Degree of Suppression of Spurious Components |
|---|---|---|---|
| 996 | 889 | 1.1 | X |
| 1,162 | 889 | 1.3 | ○ |
| 3,154 | 889 | 3.6 | ○ |
| 3,320 | 889 | 3.7 | X |

As shown in Table 11, when the A/B ratio is in the range of about 1.3 to about 3.6, the spurious components are suppressed.

Tenth Preferred Embodiment

In a tenth preferred embodiment, the sizes and structures similar to those of the particular example of the first preferred embodiment are used except for the additional films 20. In the tenth preferred embodiment, the additional films 20 are made of Pt having a density of about 21.4 g/cm$^3$ and have thicknesses of about 50 nm, about 55 nm, about 150 nm, and about 155 nm.

A relationship between the A/B ratio and the degree of spurious suppression for the piezoelectric resonators 10 including additional films 20 having these thicknesses is shown in Table 12.

TABLE 12

| A: Density × Thickness of Additional Film | B: Density × Thickness of Electrode | A/B Ratio | Degree of Suppression of Spurious Components |
|---|---|---|---|
| 1,070 | 889 | 1.2 | X |
| 1,177 | 889 | 1.3 | ○ |
| 3,210 | 889 | 3.6 | ○ |
| 3,317 | 889 | 3.7 | X |

As shown in Table 12, when the A/B ratio is in the range of about 1.3 to about 3.6, spurious components are suppressed.

Summary of First to Tenth Preferred Embodiments

Table 13 shows a summary of the upper limit and the lower limit of the range of the A/B ratio that suppresses spurious components in accordance with the acoustic impedance of the additional film 20 according to the first to tenth preferred embodiments. The acoustic impedance is defined as the square root $(\rho \times E)^{1/2}$ of the product of density $\rho$ and Young's modulus E.

TABLE 13

| Material of Additional Film | Acoustic Impedance $x: Z = \sqrt{\rho \cdot E}$ (MN · second/m³) | A/B Ratio y: Lower Limit | A/B Ratio y: Upper Limit |
|---|---|---|---|
| SiO₂ | 12 | 0.9 | 1.2 |
| Al | 14 | 1.0 | 1.5 |
| AlN | 23 | 1.2 | 2.4 |
| Ti | 33 | 1.2 | 1.8 |
| Cr | 35 | 1.2 | 3.1 |
| Cu | 43 | 1.2 | 2.4 |
| Mo | 45 | 1.3 | 3.8 |
| Ru | 60 | 1.2 | 4.0 |
| Ta | 62 | 1.3 | 3.6 |
| Pt | 71 | 1.3 | 3.6 |

Figure 4:
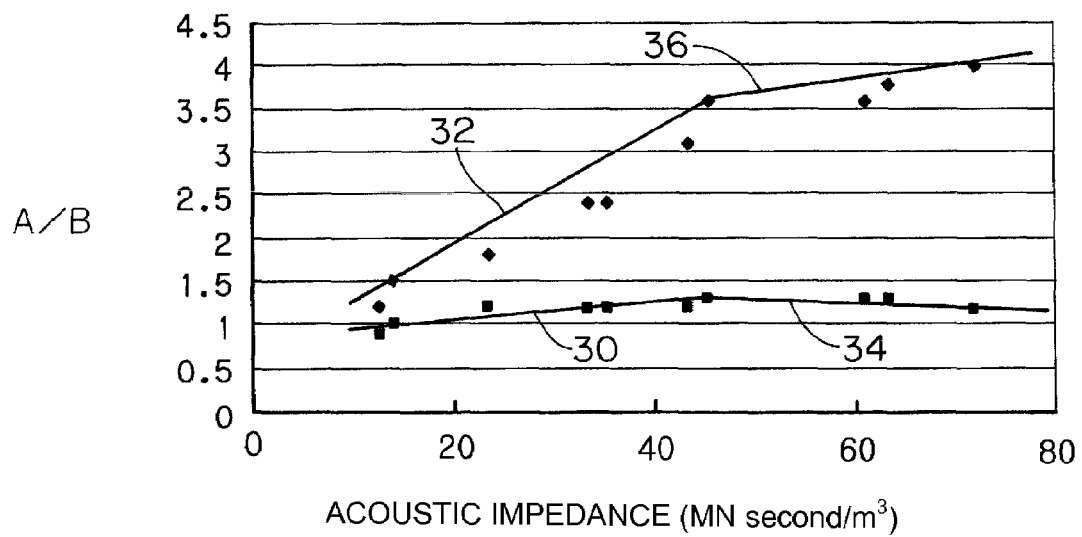
FIG. 4 is a graph illustrating an upper limit and a lower limit of an A/B ratio according to first to tenth preferred embodiments of the present invention.

FIG. 4 is a graph illustrating a relationship among the acoustic impedance of the additional film 20, the upper limit (represented by a symbol "♦"), and the lower limit (represented by a symbol "■") based on Table 13. As shown in FIG. 4, the acoustic impedance of the additional film 20 has a high correlation with the upper limit and the lower limit of the A/B ratio. The acoustic impedance of the additional film 20 has a higher correlation with the upper limit and the lower limit of the A/B ratio as compared with other material constants (e.g., the density and Young's modulus) of the additional film 20.

In FIG. 4, straight lines 30, 32, 34, and 36 are linear approximation lines of the upper limits and lower limits of the A/B ratio. Let x (MN·second/m³) be the acoustic impedance of the additional film 20 and y be the A/B ratio. Then, In the range of 9.0≦x<44.0, the linear approximation line 30 of the lower limits of the A/B ratio is expressed as: y=0.092x+0.88, and a linear approximation line 32 of the upper limits of the A/B ratio is expressed as: y=0.067x+0.60.

In the range of 44.0≦x<79.0, the linear approximation line 34 of the lower limits of the A/B ratio is expressed as: y=−0.0035x+1.45, and the linear approximation line 36 of the upper limits of the A/B ratio is expressed as: y=0.015x+2.9.

That is, spurious components are suppressed by determining the optimum A/B ratio y that satisfies the following conditional expressions in accordance with the acoustic impedance x of the additional film 20:

In the range of 9.0≦x<44.0, 0.0092·x+
0.88≦y<0.067·x+0.60 (3a)

In the range of 44.0≦x<79.0, −0.0035·x+
1.45≦y<0.015·x+2.9 (3b).

Even when the additional film 20 is made of a metal film, an alloy film, a multilayer film, or a compound film other than SiO₂, Al, AlN, Ti, Cr, Cu, Mo, Ru, Ta, and Pt used for the first to tenth preferred embodiments, spurious components can be suppressed by determining the A/B ratio that satisfies the conditional expression (3a) or (3b).

Eleventh Preferred Embodiment

The piezoelectric resonators 10 are produced such that the thickness of the piezoelectric film 16 is about 800 nm, which is less than the thickness of about 2640 nm for the first preferred embodiment, the resonant frequency Fs is about 4955 MHz, and the anti-resonant frequency Fp is about 5100 MHz. The additional films 20 are made of AlN having a density of 3.3 g/cm³. The thicknesses of the additional films 20 are about 250 nm, about 290 nm, about 360 nm, and about 400 nm. The structures of the electrodes 14 and 18 are similar to those of the particular example of the first preferred embodiment.

When the product of the density and the thickness of the AlN film of the piezoelectric film 16 is computed in the same manner, the product of a density of 3.3 g/cm³ and a thickness of 800 nm is 2640. As in the first preferred embodiment, a relationship between the A/B ratio and the degree of spurious suppression is shown in Table 14.

TABLE 14

| A: Density × Thickness of Additional Film | B: Density × Thickness of Electrode | A/B Ratio | Degree of Suppression of Spurious Components |
|---|---|---|---|
| 825 | 889 | 0.9 | X |
| 957 | 889 | 1.1 | ○ |
| 1,188 | 889 | 1.3 | ○ |
| 1,320 | 889 | 1.5 | X |

As shown in Table 14, when the A/B ratio is in the range of about 1.1 to about 1.3, spurious components are suppressed.

Twelfth Preferred Embodiment

In a twelfth preferred embodiment, a piezoelectric resonator 10 is similar to that of the eleventh preferred embodiment except for the additional films 20. In the twelfth preferred embodiment, the additional films 20 are made of Cu having a density of 8.9 g/cm³ and have thicknesses of about 100 nm, about 120 nm, about 130 nm, and about 160 nm.

A relationship between the A/B ratio and the degree of spurious suppression for the piezoelectric resonators 10 of the twelfth preferred embodiment is shown in Table 15.

TABLE 15

| A: Density × Thickness of Additional Film | B: Density × Thickness of Electrode | A/B Ratio | Degree of Suppression of Spurious Components |
|---|---|---|---|
| 890 | 889 | 1.0 | X |
| 1,068 | 889 | 1.2 | ○ |

TABLE 15-continued

| A: Density × Thickness of Additional Film | B: Density × Thickness of Electrode | A/B Ratio | Degree of Suppression of Spurious Components |
|---|---|---|---|
| 1,157 | 889 | 1.3 | ○ |
| 1,424 | 889 | 1.6 | X |

As shown in Table 15, when the A/B ratio is in the range of about 1.2 to about 1.3, spurious components are suppressed.

Thirteenth Preferred Embodiment

In a thirteenth preferred embodiment, the structures of the piezoelectric resonators 10 are similar to those of the particular example of the first preferred embodiment except for the following. Each of the thickness of Al included in the upper electrode 18 and the thickness of Al included in the lower electrode 14 is about 250 nm. The thickness of the piezoelectric film 16 is about 2360 nm. The additional films 20 are formed from Cu having a density of 8.9 g/cm$^3$ and have thicknesses of about 220 nm, about 230 nm, about 340 nm, and about 350 nm.

An impedance Smith chart is computed for each of the piezoelectric resonators 10 including the additional films 20 having these thicknesses. Subsequently, the range of the thickness of the additional film 20 that suppresses spurious components is obtained from the impedance Smith charts. For each of the thicknesses of the additional films 20, the ratio of the product of the density and the thickness of the additional film 20 to the product of the density and the thickness of the electrodes 14 and 18 and the degree of spurious suppression are summarized in Table 16.

TABLE 16

| Density × Thickness of Additional Film | Density × Thickness of Electrode | Ratio of Density × Thickness | Degree of Suppression of Spurious Components |
|---|---|---|---|
| 1,965 | 1,699 | 1.1 | X |
| 2,054 | 1,699 | 1.2 | ○ |
| 3,036 | 1,699 | 1.8 | ○ |
| 3,126 | 1,699 | 1.9 | X |

As shown in Table 16, when the A/B ratio is in the range of about 1.2 to about 1.8, spurious components are suppressed.

When the product of the density and the thickness of the AlN film of the piezoelectric film 16 is computed in the same manner, the product of a density of 3.3 g/cm$^3$ and a thickness of 2360 nm is 7788. A product B of the densities and thicknesses of the electrodes is the sum of the product of the density and thickness of a material of the upper electrode 18 and the product of the density and thickness of a material of the upper electrode 14. These values are shown in Table 17.

TABLE 17

| Material | Density (g/cm$^3$) | Thickness (nm) | Density × Thickness |
|---|---|---|---|
| Al Electrode × 2 layers | 2.7 | 500 | 1,350 |
| Pt Electrode | 21.4 | 10 | 214 |
| Ti Electrode × 3 layers | 4.5 | 30 | 135 |

TABLE 17-continued

| Material | Density (g/cm$^3$) | Thickness (nm) | Density × Thickness |
|---|---|---|---|
| Density × Thickness of Electrode | — | — | 1,699 |

Fourteenth Preferred Embodiment

A piezoelectric resonator 10a according to a fourteenth preferred embodiment is described with reference to FIG. 5.

Figure 5:
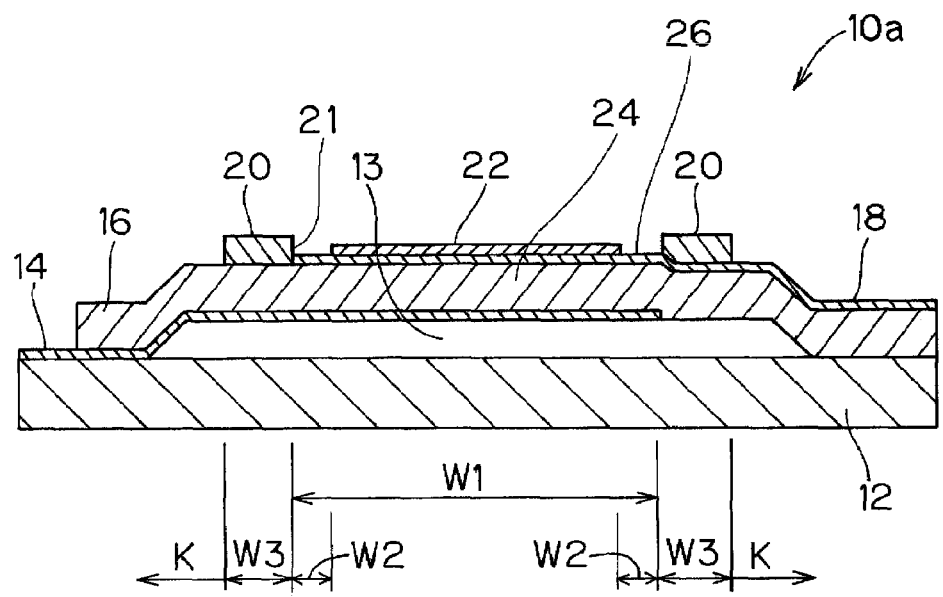
FIG. 5 is a cross-sectional view illustrating the structure of a piezoelectric resonator according to a fourteenth preferred embodiment of the present invention.

According to the fourteenth preferred embodiment, as shown in a cross-sectional view of FIG. 5, the piezoelectric resonator 10a has a structure similar to that of the first preferred embodiment. A lower electrode 14, a piezoelectric film 16, an upper electrode 18, and an additional film 20 are sequentially stacked on a substrate 12. A vibration unit 24 provided at a location raised from the substrate 12 with a gap 13 therebetween. An additional film 20 is arranged so as to extend along the peripheral edge of the vibration unit 24.

Unlike the first preferred embodiment, when viewed from the thickness direction, a stepped portion forming layer 22 is provided on the upper electrode 18. That is, a stepped portion 26 having a width of W2 is disposed inside the vibration unit 24 and along the peripheral edge of the vibration unit 24 having a width of W1.

More specifically, the substrate 12 is made of Si. The piezoelectric film 16 is made of AlN and has a thickness of about 2640 nm. The upper electrode 18 includes an Al layer having a thickness of about 100 nm and a Ti layer having a thickness of about 10 nm. The Ti layer is arranged so as to be adjacent to the piezoelectric film 16. The lower electrode 14 includes an Al layer having a thickness of about 100 nm and a Ti layer having a thickness of about 10 nm in this order from the side adjacent to the piezoelectric film 16. The additional film 20 is made of SiO$_2$ having a thickness of about 370 nm. The stepped portion forming layer is made of SiO$_2$ having a thickness of about 20 nm. A resonant frequency Fs of the piezoelectric resonator 10a is about 1840 MHz. An anti-resonant frequency Fp is about 1891 MHz.

The AlN film of the piezoelectric film 16 may be patterned so as to extend over the entirety upper surface of the substrate 12. Alternatively, the AlN film of the piezoelectric film 16 may be patterned so as to extend only on the vibration unit 24 having a width of W1 and an additional film portion having a width of W3 and so as not to be formed on an outer portion indicated by a reference symbol "K". A terminal portion of the lower electrode 14 is led out through a hole formed in the AlN film of the piezoelectric film 16 by etching.

Assume that the major film structure of the vibration unit 24 includes Al (about 100 nm), AlN (about 2640 nm), and Al (about 100 nm) (note that since the thickness of Ti is small, Ti can be ignored). Then, the optimum thickness of the SiO$_2$ film of the additional film 20 can be in the range of about 300 nm to about 500 nm, the optimum thickness of the SiO$_2$ film of the stepped portion forming layer 22 can be in the range of about 5 nm to about 30 nm, the optimum width W2 of the stepped portion 26 can be in the range of about 10 μm to about 30 μm, the optimum width W3 of the additional film portion can be in the range of about 5 μm to about 50 μm, the lower electrode 14 may include Pt (about 10 nm), Ti (about 10 nm), Al (about 100 nm), and Ti (about 10 nm) in this order from the side adjacent to the piezoelectric film 16, and the stepped portion may be formed by adding $SiO_2$ defining the stepped portion forming layer 22 or by adding Ti or Al.

By depositing the additional film 20 having an appropriately controlled thickness around the vibration unit 24, the piezoelectric resonator 10a suppresses spurious components in the range from the resonant frequency to the anti-resonant frequency without losing the energy of thickness extensional vibration.

In addition, by forming the controlled stepped portion 26 around the vibration unit 24 and inside the additional film 20, spurious components in the range less than or equal to the resonant frequency are suppressed without losing the energy of thickness extensional vibration.

Figure 6:
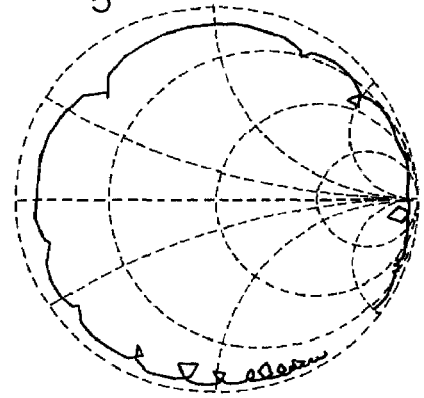
FIG. 6 is a Smith chart of the piezoelectric resonator according to the fourteenth preferred embodiment of the present invention.
Figure 6:
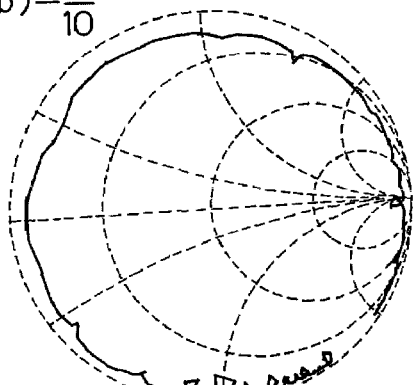
Figure 6:
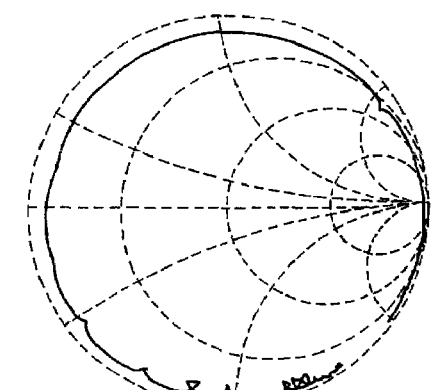
Figure 6:
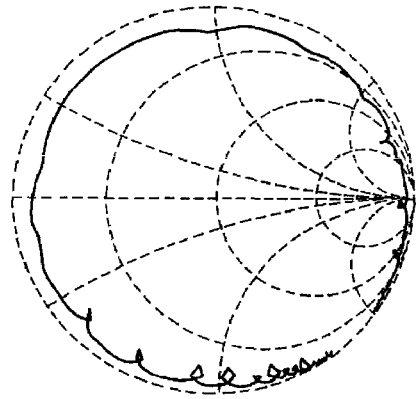
Figure 6:
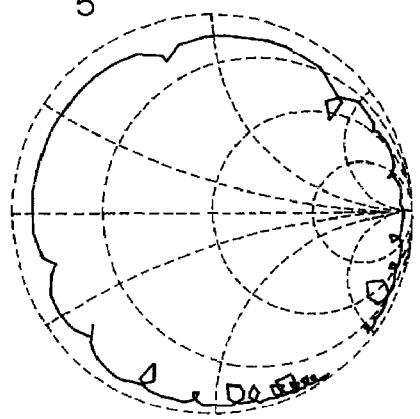

The Smith chart of the resonant characteristic of the structure shown in FIG. 5 is shown in FIG. 6C described below. When compared with the resonant characteristic shown in FIG. 3 where the stepped portion forming layer 22 is not provided, spurious components in the range less than or equal to the resonant frequency are suppressed.

By appropriately selecting the width W2 of the stepped portion 26 and the material and the thickness of the additional film 20, the boundary between the stepped portion 26 and the vibration unit 24 becomes a free end, and therefore, a displacement is maximized at that point. Thus, further uniform displacement inside the vibration unit 24 can be obtained. Consequently, thickness extensional vibration including only ideal principal vibration is obtained. The width and thickness of the stepped portion 26 that suppresses spurious components vary in accordance with the material characteristics (the density, Young's modulus, and the acoustic impedance) of the stepped portion forming layer 22.

In summary, for a resonator having a high-frequency cut-off distribution characteristic (typically, the characteristic of the AlN single-layer fundamental wave), spurious components greater than the resonant frequency can be suppressed without losing the energy of principal vibration of the thickness extensional vibration by depositing an additional film having an appropriate thickness around the vibration unit, and spurious components less than the resonant frequency can be suppressed without losing the energy of principal vibration of the thickness extensional vibration by forming a stepped portion having an appropriate thickness and an appropriate width inside the additional film.

The influence of a positional shift between the opening 21 of the additional film 20 and the end of the vibration unit 24 when viewed in the thickness direction is described next.

Let L be a distance between the opening 21 of the additional film 20 and the end of the vibration unit 24 when viewed in the thickness direction. Thus, it is defined as L=0 when the position of the opening 21 of the additional film 20 coincides with the position of the end of the vibration unit 24 when viewed in the thickness direction. It is also defined that a distance in a direction in which the additional film 20 moves away from the vibration unit 24 is negative. A distance in a direction in which the additional film 20 overlaps with the vibration unit 24 (i.e., a direction in which the additional film 20 moves towards the center of the vibration unit 24) is positive. However, if the end surface has a tapered shape, the distance L represents the smallest distance between the opening 21 of the additional film 20 and the end of the vibration unit 24. FIGS. 6A to 6E are the Smith charts when $\lambda/2=t$ (μm) and the distance $L=-\lambda/5, -\lambda/10, 0, \lambda/10,$ and $\lambda/5$, where $\lambda$ is the wavelength of the thickness extensional vibration, and t is the film thickness of the vibration unit 24.

As can be seen from FIGS. 6A-6E, it is desirable that the distance L between the end of the vibration unit 24 and the end of the additional film 20 is greater than or equal to about $-\lambda/10$ and less than or equal to about $\lambda/10$, that is, the distance L is in the range of about $-t/5$ and about $t/5$ where spurious components are suppressed.

Fifteenth Preferred Embodiment

A piezoelectric resonator according to a fifteenth preferred embodiment is described next with reference to FIGS. 7A to 7E.

Unlike the first preferred embodiment, in the fifteenth preferred embodiment, a stepped portion forming layer 22 is provided, and the shapes of additional films 20a to 20e are different from those of the first preferred embodiment. In the following description, similar numbering will be used in describing similar components as used above to describe the first preferred embodiment, and differences are primarily described. FIGS. 7A to 7E correspond to FIG. 1B of the first preferred embodiment.

Figure 7A:
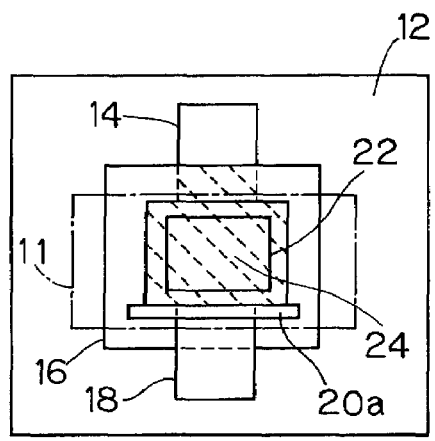
FIGS. 7A to 7E are cross-sectional views illustrating the structure of a piezoelectric resonator according to a fifteenth preferred embodiment of the present invention.
Figure 7B:
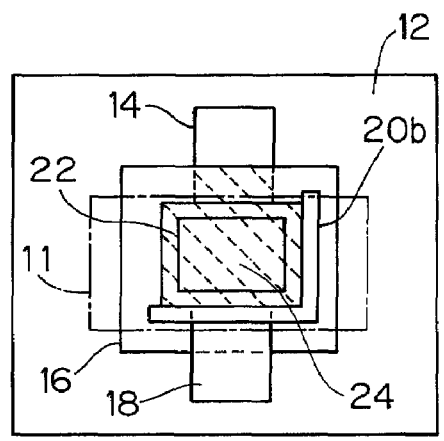
Figure 7C:
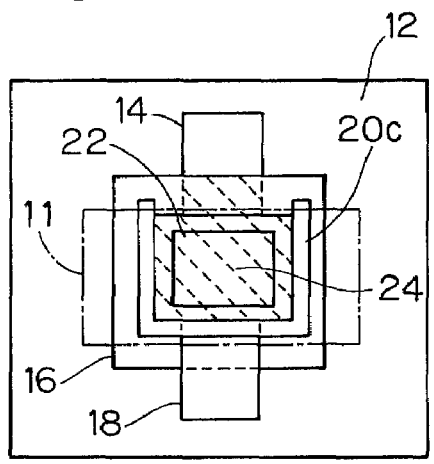

As shown in FIGS. 7A to 7C, each of the additional films 20a to 20c may be only partially disposed around the vibration unit 24.

Figure 7D:
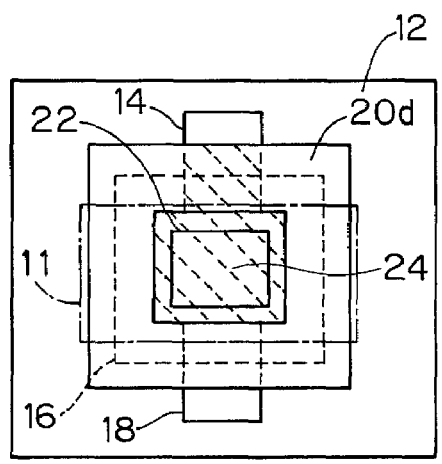
Figure 7E:
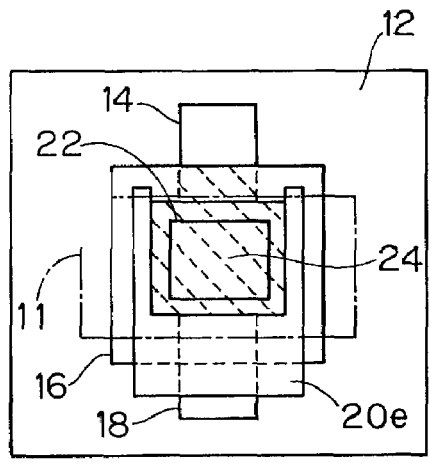

In addition, similar to the additional film 20d shown in FIG. 7D, the additional film 20d may extend beyond the sacrificial layer 11 for forming a gap 13 and the piezoelectric film 16 and may reach the substrate 12.

The width of the additional film need not be uniform. For example, similar to the additional film 20e shown in FIG. 7E, the additional film may include a portion having a large width and a portion having a small width.

In either case, advantages that are similar to those of the first and fourteenth preferred embodiments can be provided in greater or lesser degrees.

Sixteenth Preferred Embodiment

A piezoelectric resonator 10b according to a sixteenth preferred embodiment is described next with reference to FIG. 8.

Figure 8:
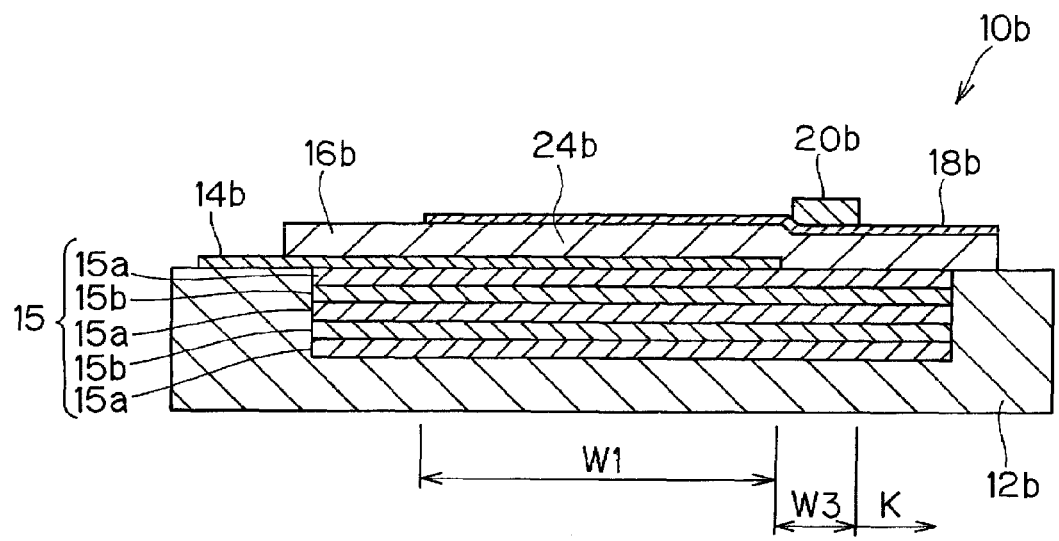
FIG. 8 is a cross-sectional view illustrating the structure of a piezoelectric resonator according to a sixteenth preferred embodiment of the present invention.

As shown in FIG. 8, in the piezoelectric resonator 10b, a vibration unit 24b is provided on an acoustic reflecting layer 15, which is provided in place of a gap. The vibration unit 24b includes a piezoelectric film 16b sandwiched between a lower electrode 14b and an upper electrode 18b. The acoustic reflecting layer 15 is formed by alternately stacking a sub-layer 15a and a sub-layer 15b on a substrate 12b into at least three layers. Each of the sub-layer 15a and the sub-layer 15b has a thickness of about ¼ wavelength of an operating frequency. In addition, the sub-layer 15a and the sub-layer 15b have different acoustic impedances. A vibration unit 24b having a width of W1 is acoustically isolated from the substrate 12b by the acoustic reflecting layer 15. An additional film 20b is disposed only on the upper electrode 18b. Thus, an additional film portion having a width of W3 is provided. An outer portion is indicated by a reference symbol "K".

More specifically, the substrate 12b is made of Si. One sub-layer 15a of the acoustic reflecting layer 15 is made of $SiO_2$ and has a thickness of about 780 nm. The other sub-layer 15b is made of W and has a thickness of about 650 nm. The piezoelectric film 16b is made of AlN and has a thickness of about 2640 nm. The upper electrode 18b is made of an Al layer having a thickness of about 100 nm and a Ti layer having a thickness of about 10 nm. Ti is disposed so as to be adjacent to the piezoelectric film 16b. The lower electrode 14b includes an Al layer having a thickness of about 100 nm and a Ti layer having a thickness of about 10 nm layered on the piezoelectric film 16b in this order. The additional film 20b is made Cu. The resonant frequency Fs of the piezoelectric resonator 10*b* is about 1910 MHz, and the anti-resonant frequency Fp of the piezoelectric resonator 10*b* is about 1951 MHz.

The piezoelectric resonator 10*b* provides advantages similar to those of the first preferred embodiment.

Seventeenth Preferred Embodiment

Figure 9:
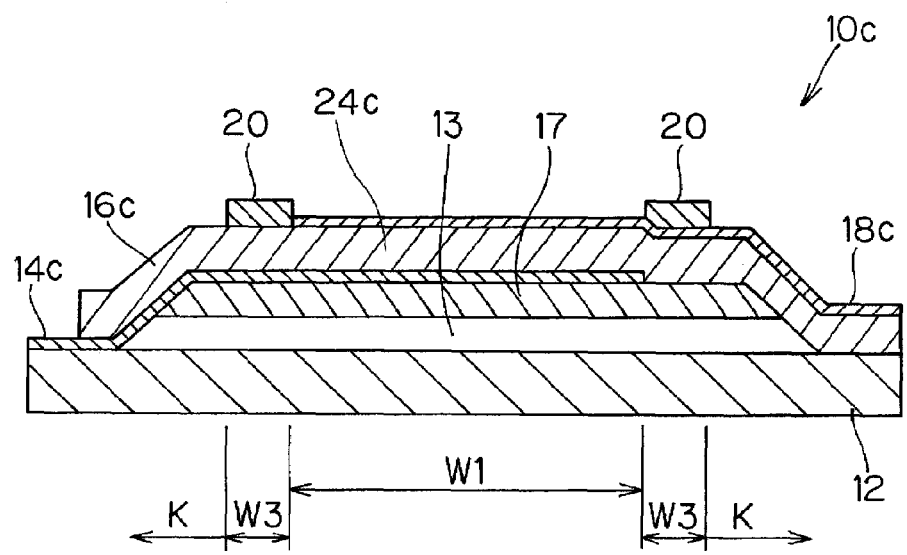
FIG. 9 is a cross-sectional view illustrating the structure of a piezoelectric resonator according to a seventeenth preferred embodiment of the present invention.

A piezoelectric resonator 10*c* according to a seventeenth preferred embodiment is described next with reference to FIG. 9.

The piezoelectric resonator 10*c* has a structure similar to that of the piezoelectric resonator according to the first preferred embodiment. However, unlike the first preferred embodiment, a supplementary film 17 is disposed under a lower electrode 14*c*. In addition, the piezoelectric resonator 10*c* has a second-harmonic wave structure in which a portion in which a piezoelectric film 16*c* is sandwiched between electrodes 14*c* and 18*c*, and a portion having a width indicated by "W1" define a vibration unit 24*c*. A gap 13 is provided between the supplementary film 17 and the substrate 12. Thus, the vibration unit 24*c* is acoustically isolated from the substrate 12. An additional film 20 having a width indicated by "W3" is disposed around the vibration unit 24*c*. An outer portion indicated by "K" continuously extends from the additional film 20.

More specifically, the substrate 12 is made of Si. The supplementary film 17 is made of $SiO_2$ and has a thickness of about 2.1 μm. The piezoelectric film 16*c* is made of AlN and has a thickness of about 2.0 μm. The upper electrode 18*c* is made of an Al layer having a thickness of about 100 nm and a Ti layer having a thickness of about 10 nm. The Ti layer is disposed so as to be adjacent to the piezoelectric film 16*c*. The lower electrode 14*c* includes an Al layer having a thickness of about 100 nm and a Ti layer having a thickness of about 10 nm layered from the side adjacent to the piezoelectric film 16*c* in this order. The additional film 20 is made of $SiO_2$. The resonant frequency Fs of the piezoelectric resonator 10*c* is about 1922 MHz, and the anti-resonant frequency Fp of the piezoelectric resonator 10*c* is about 1941 MHz.

The piezoelectric resonator 10*c* provides advantages similar to those of the first preferred embodiment. Since $SiO_2$ used for the supplementary film 17 has the temperature coefficient of the TCF with a sign opposite to that of AlN and ZnO used for the piezoelectric film 16*c*, the temperature characteristic of the piezoelectric resonator 10*c* can be improved by using the supplementary film 17.

Eighteenth Preferred Embodiment

According to an eighteenth preferred embodiment, a lattice filter is provided by arranging a plurality of piezoelectric resonators on the same substrate in a planar direction. The piezoelectric resonators are connected to each other in a lattice having any number of stages. According to the eighteenth preferred embodiment, at least one of the resonators of the lattice filter defined by the resonator according to any one of the first to seventeenth preferred embodiments. In this way, the ladder filter according to the eighteenth preferred embodiment suppresses spurious components of the resonator and provides a high Q value regardless of the shapes of the electrodes. Accordingly, ripples in the passband are reduced. The attenuation characteristic in the passband can be made steep. Thus, the size of the ladder filter can be easily reduced.

Modification of Eighteenth Preferred Embodiment

According to a modification of the eighteenth preferred embodiment, a ladder filter is provided by arranging a plurality of piezoelectric resonators on the same substrate in a planar direction and connecting series resonators and parallel resonators in the define a ladder having any number of stages. According to the modification of the eighteenth preferred embodiment, at least one of the series resonators and parallel resonators of the ladder filter is defined by the resonator according to any one of the first to seventeenth preferred embodiments. In this way, the ladder filter according to the modification of the eighteenth preferred embodiment suppresses spurious components of the resonator and provides a high Q value regardless of the shapes of the electrodes. Accordingly, ripples in the passband are reduced. The attenuation characteristic in the passband can be made steep. Thus, the size of the ladder filter can be easily reduced.

Nineteenth Preferred Embodiment

According to a nineteenth preferred embodiment, a balanced filter is provided by arranging a plurality of piezoelectric resonators on the same substrate in a planar direction. The piezoelectric resonators are connected so as to form the balance filter. In the balanced filter according to the nineteenth preferred embodiment, at least one of the resonators of the balanced filter is defined by the resonator according to any one of the first to seventeenth preferred embodiments. In this way, the balanced filter according to the nineteenth preferred embodiment suppresses spurious components of the resonator and provides a high Q value regardless of the shapes of the electrodes. Accordingly, ripples in the passband are reduced. The attenuation characteristic in the passband can be made steep. Thus, the size of the ladder filter can be easily reduced.

Twentieth Preferred Embodiment

Figure 10:
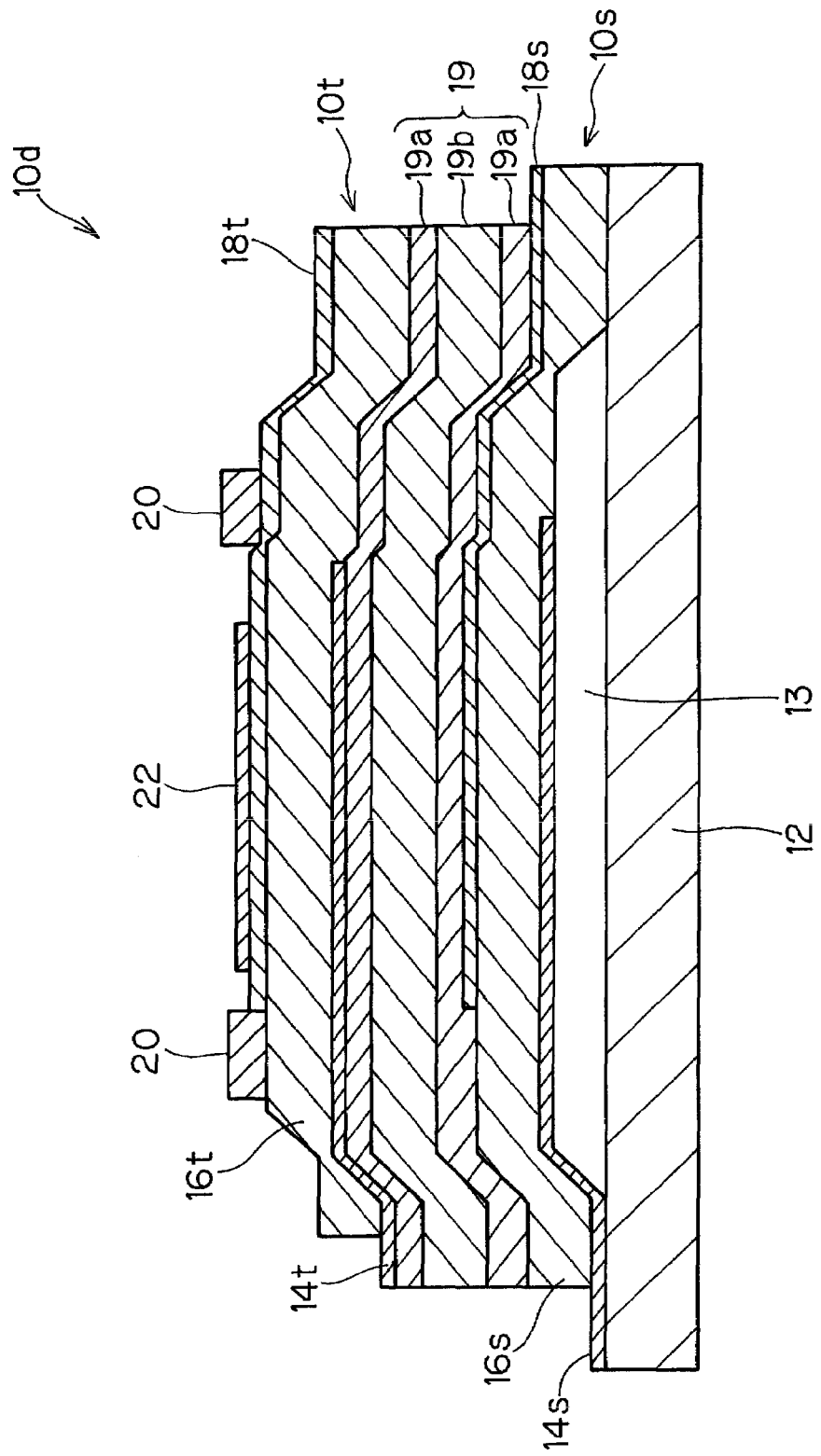
FIG. 10 is a cross-sectional view illustrating the structure of a dual-mode filter according to a twentieth preferred embodiment of the present invention.

A dual-mode filter 10*d* according to a twentieth preferred embodiment is described next with reference to FIG. 10.

In the dual-mode filter 10*d*, a lower electrode 14*s*, a piezoelectric film 16*s*, and an upper electrode 18*s* are stacked on a substrate 12 so as to define a first resonator 10*s*. An insulating layer 19*a*, a piezoelectric film 19*b*, and an insulating layer 19*a* are stacked on the first resonator 10*s* so as to define an acoustic coupling layer 19. Furthermore, a lower electrode 14*t*, a piezoelectric film 16*t*, an upper electrode 18*t*, an additional film 20, and a stepped portion forming layer 22 are stacked on the acoustic coupling layer 19 so as to define a second resonator 10*t*. The electrodes 14*s* and 18*s* of the first resonator are connected to an output terminal, while the electrodes 14*t* and 18*t* of the second resonator are connected to an input terminal.

The first resonator 10*s* is connected to the second resonator 10*t* via the acoustic coupling layer 19 so that double mode vibration is excited. Thus, a filter characteristic can be obtained.

In the dual-mode filter 10*d*, spurious components of the first resonator 10*s* and the second resonator 10*t* having the additional film 20 are suppressed, and a high Q value is provided. Accordingly, ripples in the passband are reduced. The attenuation characteristic in the passband can be made steep.

In addition, in the dual-mode filter 10*d*, the first resonator 10*s* is overlapped with the second resonator 10*t* in the thickness direction. Accordingly, a compact dual-mode filter having a small area is obtained.

It should be noted that the present invention is not limited to the above-described preferred embodiments. Various modifications can be made in the present invention. For example, any material having a Poisson ratio less than or equal to about 1/3 can be used for a piezoelectric film. Accordingly, a piezoelectric material other than AlN used for the above-described preferred embodiments may be used. Furthermore, an additional film may be made of an insulating material, a semiconductor, or a metal that satisfies the conditions described above in addition to the materials shown in Table 1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric resonator comprising:

a substrate; and a thin film unit including a portion supported by the substrate and a portion acoustically isolated from the substrate, the portion acoustically isolated from the substrate including a vibration unit and an additional film, the vibration unit including a piezoelectric film sandwiched between a pair of electrodes and having a Poisson ratio less than or equal to about 1/3, the piezoelectric film being overlapped with the pair of electrodes in plan view, the additional film being disposed on one of the piezoelectric film and the electrode so as to extend along at least a portion of a periphery of the vibration unit in plan view; wherein when x (MN·second/m³) denotes an acoustic impedance of the additional film defined by the square root of the product of the density and Young's modulus, A denotes the product of the density and the thickness of the additional film, B denotes the product of the densities and the thicknesses of the electrodes, and y=A/B, the A/B ratio y satisfies one of the following conditional expressions (1a) and (1b):

In the range of 9.0≦x<44.0, 0.0092·x+
0.88≦y<0.067·x+0.60 (1a)

In the range of 44.0≦x<79.0, −0.0035·x+
1.45≦y<0.015·x+2.9 (1b).

2. The piezoelectric resonator according to claim 1, wherein a stepped portion forming film is provided on one of the two electrodes remote from the substrate so as to extend inside the periphery of the vibration unit and along the periphery of the vibration unit with a space therebetween in plan view.

3. The piezoelectric resonator according to claim 1, wherein when L (μm) denotes a distance between an end of the vibration unit and an end of the additional film adjacent to the vibration unit, a direction in which the end of the additional film moves away from the vibration unit is negative, a direction in which the additional film overlaps with the vibration unit is positive, and t (μm) denotes the thickness of the vibration unit, the following conditional expression (2) is satisfied:

−t/5≦L≦t/5 (2).

4. The piezoelectric resonator according to claim 1, wherein the piezoelectric film is made of AlN.

5. The piezoelectric resonator according to claim 1, wherein the additional film is made of one of SiO₂ and AlN.

6. The piezoelectric resonator according to claim 1, wherein the additional film is made of an electrical conductive material.

7. A filter comprising:

at least one piezoelectric resonators according to claim 1 arranged in a planar direction.

8. A dual-mode filter comprising:

at least two of the piezoelectric resonators according to claim 1 stacked in a thickness direction and acoustically coupled in the thickness direction.

9. A piezoelectric resonator comprising:

a substrate; and a thin film unit including a portion supported by the substrate and a portion acoustically isolated from the substrate, the portion acoustically isolated from the substrate including a vibration unit and an additional film, the vibration unit including a piezoelectric film sandwiched by a pair of electrodes and having a Poisson ratio less than or equal to about 1/3, the piezoelectric film being overlapped with the pair of electrodes in plan view, the additional film being disposed on one of the piezoelectric film and the electrode so as to extend along at least a portion of a periphery of the vibration unit in plan view; wherein the additional film is made of any one of SiO₂, Al, AlN, Ti, Cr, Cu, Mo, Ru, Ta, and Pt; and when A denotes the product of the density and the thickness of the additional film, B denotes the product of the density and the thickness of the electrodes, and y=A/B, the A/B ratio y lies in the range of a lower limit and an upper limit indicated in the following Table 1:

TABLE 1

| Material of Additional Film | Acoustic Impedance x: Z = √ρ · E (MN · second/m³) | A/B Ratio y: Lower Limit | A/B Ratio y: Upper Limit |
|---|---|---|---|
| SiO₂ | 12 | 0.9 | 1.2 |
| Al | 14 | 1.0 | 1.5 |
| AlN | 23 | 1.2 | 2.4 |
| Ti | 33 | 1.2 | 1.8 |
| Cr | 35 | 1.2 | 3.1 |
| Cu | 43 | 1.2 | 2.4 |
| Mo | 45 | 1.3 | 3.8 |
| Ru | 60 | 1.2 | 4.0 |
| Ta | 62 | 1.3 | 3.6 |
| Pt | 71 | 1.3 | 3.6. |

10. The piezoelectric resonator according to claim 9, wherein a stepped portion forming film is provided on one of the two electrodes remote from the substrate so as to extend inside the periphery of the vibration unit and along the periphery of the vibration unit with a space therebetween in plan view.

11. The piezoelectric resonator according to claim 9, wherein when L (μm) denotes a distance between an end of the vibration unit and an end of the additional film adjacent to the vibration unit, a direction in which the end of the additional film moves away from the vibration unit is negative, a direction in which the additional film overlaps with the vibration unit is positive, and t (μm) denotes the thickness of the vibration unit, the following conditional expression (2) is satisfied:

−t/5≦L≦t/5 (2).

12. The piezoelectric resonator according to claim 9, wherein the piezoelectric film is made of AlN.

13. The piezoelectric resonator according to claim 9, wherein the additional film is made of one of SiO₂ and AlN.

14. The piezoelectric resonator according to claim 9, wherein the additional film is made of an electrical conductive material.

15. A filter comprising:
  at least one piezoelectric resonator according to claim 9 arranged in a planar direction.

16. A dual-mode filter comprising:
  at least two of the piezoelectric resonators according to claim 9 stacked in a thickness direction and acoustically coupled in the thickness direction.

* * * * *